June 29, 1965 P. BAUER 3,191,611
"AND" GATE
Filed Jan. 25, 1963 2 Sheets-Sheet 1

INVENTOR
PETER BAUER
BY Griffin and Stokes
ATTORNEYS

United States Patent Office 3,191,611
Patented June 29, 1965

3,191,611
"AND" GATE

Peter Bauer, Rockville, Md., assignor to Sperry Rand Corporation, New York, N.Y., a corporation of Delaware Filed Jan. 25, 1963, Ser. No. 253,823
5 Claims. (Cl. 137—81.5)

The present invention relates to fluid-operated devices for performing the logical AND function. More particularly, the present invention provides a plurality of series-connected fluid amplifiers and a plurality of sources of fluid signals, said sources being selectively and independently operable to apply fluid control signals to the amplifiers whereby an output signal is produced in one output channel of the last amplifier in the series only when said sources apply control signals to all of the amplifiers concurrently.

Since the invention of the first fluid amplifier there has been considerable activity toward the goal of developing digital data processing devices wherein all or most of the logical functions are performed by selectively controlling the direction of flow of fluid streams.

One of the basic building blocks of digital data systems is the logical AND gate. In the electronic field there are many types of AND gates but, functionally speaking, each type produces an output signal only when input signals are applied concurrently to all of its inputs.

One of the earliest types of fluid amplifier AND gates employed analog techniques in a single fluid amplifier. In these devices each control stream struck the power stream to deflect it slightly from its normal path. Upon simultaneous application of all control streams the power stream was deflected sufficiently so that it flowed into a desired output channel. In these devices careful control had to be maintained so that the momentum of the control streams remained constant otherwise the amount of deflection imparted to the power stream by the control streams would vary.

Other types of fluid AND gates have been developed but these gates have an inherent delay which increases proportionally as the number of inputs increases. Furthermore, fluid amplifiers employed in these gates include certain channel configurations which preclude their general use in other logical building blocks.

Accordingly, a primary object of the present invention is to provide pure fluid AND gates employing fluid amplifiers having a channel configuration which makes them suitable for use in other logic elements.

An object of the present invention is to provide pure fluid AND gates having a faster response time than the gates previously employed.

An object of the present invention is to provide a fluid-operated AND gate comprising first and second fluid amplifiers each having a power stream input, a first output for normally receiving the power stream, a second output, and a control signal input for deflecting the power stream into the second output. A fluid source supplies fluid to the power stream input of the first amplifier with the second output of the first amplifier being connected to the power stream input of the second amplifier. Means are provided for selectively and simultaneously applying fluid control signals to the control signal inputs of the amplifiers with fluid flow from the second output of the second amplifier indicating that control signals are being applied simultaneously to the control signal inputs of both amplifiers.

Still another object of the invention is to provide a pure fluid operated AND gate comprising a plurality of fluid amplifiers each having a power stream input, a first output for normally receiving the power stream, a second output, and a control signal input for deflecting the power stream so that it flows into the second output. The amplifiers are connected in series with the second output of each amplifier in the series being connected to the power stream input of the next amplifier in the series. A source provides a power stream for the first amplifier in the series and a plurality of sources selectively and concurrently apply fluid control signals to the control signal inputs of all of the amplifiers whereby fluid from said power source appears in the second output channel of the last amplifier in the series only when control signals are concurrently applied to the control signal inputs of all of the amplifiers.

When fluid amplifiers are connected in series as described in the preceding paragraph there is some degradation of the signal or loss of power as the fluid power stream passes through each amplifier. However, in accordance with the present invention the power stream may be amplified or reconstituted by splitting the series-connected amplifiers into first and second groups and inserting between the groups an additional amplifier similar to the ones which perform the logical operation but which, in fact, merely performs an amplification function.

Therefore, a further object of the present invention is to provide first and second groups of series-connected amplifiers each having a power stream input, a first output for normally receiving the power stream, a second output, and a control signal input for deflecting the power stream to the second output. The second output of each amplifier is connected to the power stream input of the next amplifier in its series with the second output of the last amplifier in the first series being connected to the control signal input of the first amplifier in the second series. Independently operable sources of fluid signals selectively and concurrently apply input signals to the control signal inputs of the remaining amplifiers and a source of fluid power is connected to the power stream inputs of the first amplier in each group. With this arrangement there is fluid flow through the second output of the last amplifier in the second group only when control signals are applied to each amplifier concurently.

A further feature of the invention is the provision of first, second and third groups of series-connected amplifiers with the output from the last amplifier in the first and second groups being connected to the control signal input channels of the amplifiers in the third group. In this arrangement the first and second groups are connected in parallel with each other to thus reduce the time required to perform the logical AND function when several variables are involved.

Other objects of the invention and its mode of operation will become apparent upon consideration of the following description and the accompanying drawings in which.

The pure fluid amplifiers subsequently described may employ air or another gas or water or another liquid as the working fluid. If desired, solid particles may be entrained in the working fluid. The amplifiers may be constructed of plastic, metallic, ceramic or other material. For ease of illustration they are shown in the accompanying drawing as being made of a clear plastic material.

The amplifiers may, for example, be made from three flat plates. The desired channel configuration is cut, etched, stamped or otherwise formed in one of the plates. This plate is then covered on each side with the other two plates and the plates screwed or otherwise bonded together to form a substantially solid body. The body is then bored and tapped so that pipes may be attached to apply signals to and convey signals from the amplifier. This construction is well known in the art hence the accompanying drawing shows only the channel configurations which define the paths of fluid flow. Reference may be had to U.S. Patent No. 3,001,698 for an illustration of an amplifier constructed as described above. The present invention is not limited to AND gates employing amplifiers constructed in the above-described manner. For example, amplifiers employing only two flat plates such as those described in Patent No. 3,030,979 may be employed. Other constructions known in the art are equally suitable for use in practicing the present invention. It should be understood that the term "channel" as used herein refers to pipes, tubes, closed ducts or other closed passageways for conveying fluid and the term "orifice" includes restricted or unrestricted openings.

Figure 1:
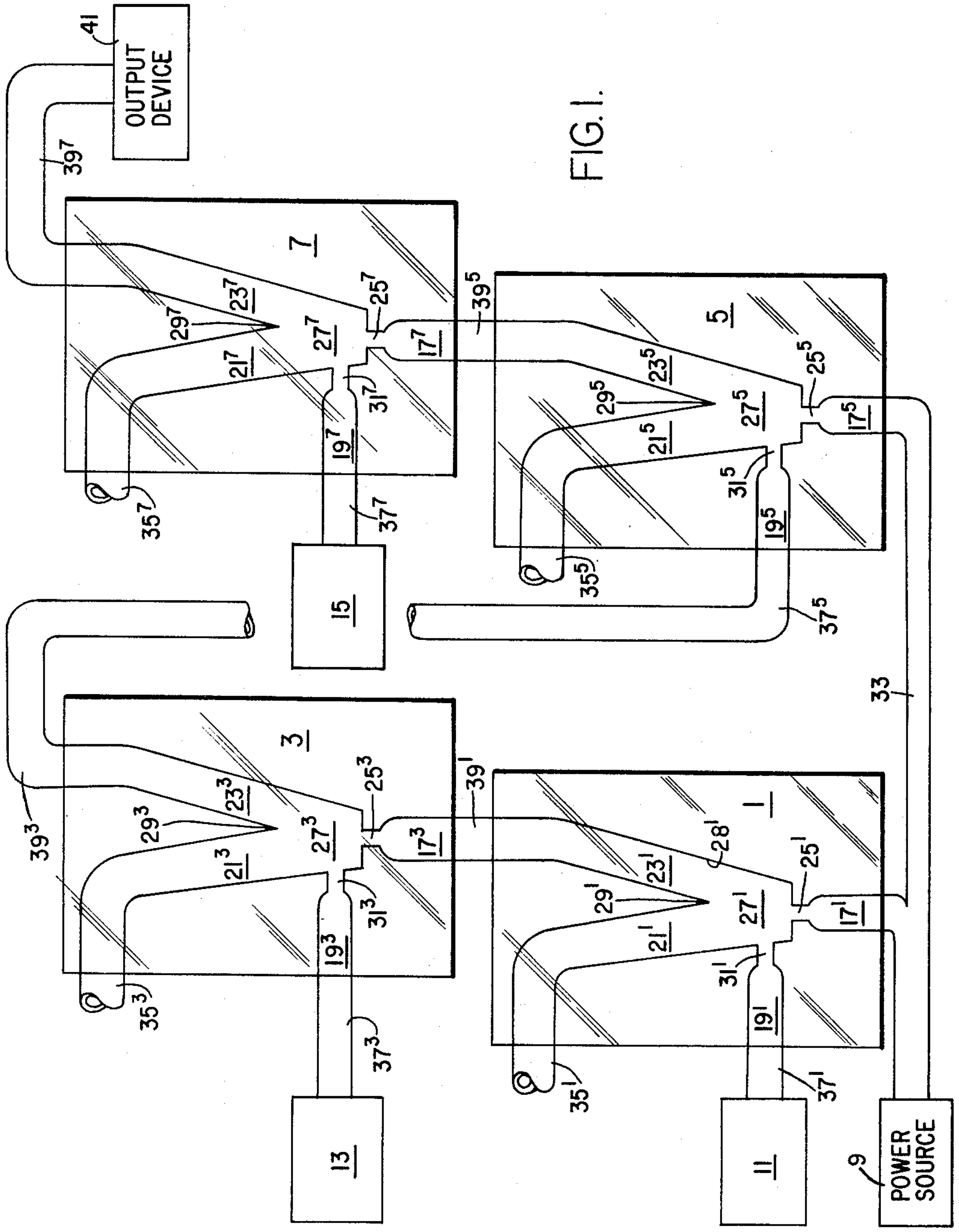
FIGURE 1 illustrates a first embodiment of the invention.

Referring now to FIGURE 1, a preferred embodiment of the invention is shown as comprising four pure fluid amplifiers 1, 3, 5 and 7, a fluid power source 9, and three independently operable sources 11, 13 and 15 for selectively or simultaneously producing fluid output signals representing variables A, B and C.

Fluid amplifier 1 has a power stream input channel 17$^1$, a control signal input channel 19$^1$, a first output channel 21$^1$ and a second output channel 23$^1$. Power stream input channel 17$^1$ terminates at an orifice 25$^1$ in the upstream wall of chamber 27$^1$ which is formed by the intersection of the output channels 21$^1$ and 23$^1$. A dividing element 29$^1$ is formed by the intersection of the walls of the channels 21$^1$ and 23$^1$. This dividing element is offset to the right as shown in the drawing so that a power stream emerging from orifice 25$^1$ in the absence of a control stream flows to the left of the dividing element and into output channel 21$^1$.

Control signal input channel 19$^1$ terminates at an orifice 31$^1$ in the side wall of the chamber 27$^1$. Orifice 31$^1$ is located downstream from orifice 25$^1$ and upstream from the dividing element 29$^1$ so that a control stream issuing therefrom may strike a power stream issuing from orifice 25$^1$ and deflect the power stream so that it flows into the output channel 23$^1$.

Fluid amplifier 1 functions as follows. Power source 9 which may be a pump or compressor continuously supplies fluid over a channel 33 to the power stream input channel 17$^1$. Preferably, power source 9 includes a pressure regulator of conventional design such that the fluid stream is applied to channel 33 under substantially constant pressure. Fluid entering power stream input channel 17$^1$ flows through orifice 25$^1$ and enters the chamber 27$^1$. Because the size of the orifice is less than the size of the power stream input channel the power stream increases in velocity as it flows through the orifice and thus enters the chamber as a high velocity jet stream. As stated before, the dividing element 29$^1$ is offset to the right of the normal path of the power jet stream so that in the absence of a control signal input the power jet stream flows to the left of the dividing element and enters output channel 21$^1$. Output channel 21$^1$ may be connected by means of a channel 35$^1$ to the fluid return side of the power source 9.

When signal source 11 produces a fluid output pulse indicating the presence of the signal A, this output pulse is conveyed by means of a channel 37$^1$ to the control signal input channel 19$^1$. From control signal input channel 19$^1$ the fluid input signal passes through orifice 31$^1$ and enters chamber 27$^1$ as a high velocity control jet stream. The control jet strikes the power jet emerging from orifice 25$^1$ and deflects it into the output channel 23$^1$.

When signal source 11 stops producing a fluid output signal, the control jet ceases at orifice 31$^1$. With no force acting against it, the power stream energing from orifice 25$^1$ returns to its normal path of flow and flows into output channel 21$^1$.

From the above description it is apparent that chamber 27$^1$ is designed such that with the power stream pressure utilized the amplifier does not exhibit a bistable characteristic. That is, wall 28$^1$ is offset from orifice 25$^1$ sufficiently far that the well known boundary layer phenomenon does not occur to cause the power stream to "lock-on" to the wall in the absence of a control stream.

A plurality of amplifiers similar to amplifier 1 may be connected in series to perform the logical AND function. Thus, in the drawing amplifiers 1 and 3 are connected in series to perform the logical function $X=A\cdot B$ with X being manifested by fluid flow in the output channel 39$^3$ and A and B being manifested by fluid signals applied to the control signal input channels 19$^1$ and 19$^3$, respectively.

Amplifier 3 is identical to amplifier 1 with like parts in the drawing bearing the same reference numeral with an appropriate superscript. Output channel 23$^1$ is connected by means of a channel 39$^1$ to the power stream input channel 17$^3$. A channel 37$^3$ conveys fluid pulses generated by pulse source 13 to the control signal input channel 19$^3$. Output channel 21$^3$ may be connected by means of a channel 35$^3$ to the fluid reutrn side of the power source.

Amplifiers 1 and 3 determine the truth of the logical function $X=A\cdot B$ in the following manner where the $(\cdot)$ indicates the logical AND function. Assume first that we have the condition $\overline{A}$ and $\overline{B}$ (not A and not B). That is, signal source 11 is not applying a fluid signal to control signal input channel 19$^1$ and signal source 13 is not applying a fluid signal to control signal input channel 19$^3$. When this condition exists the power stream applied to power stream input channel 17$^1$ emerges from orifice 25$^1$ and flows into output channel 21$^1$ because there is no control jet issuing from orifice 31$^1$ to deflect it. As a result, there is no power stream applied to power stream input channel 17$^3$ and an output signal does not flow through output channel 39$^3$.

Consider now the case where we have $\overline{A}\cdot B$. That is, signal source 13 is applying a fluid signal to control signal input channel 19$^3$ but signal source 11 is not applying a fluid signal to control signal input channel 19$^1$. Under this condition the power stream flowing through channel 17$^1$ again passes through chamber 27$^1$ and into output channel 21$^1$ because no control jet is issuing from orifice 31$^1$. Since the power stream of amplifier 1 is not deflected into the channel 23$^1$ there is no power stream flow into the chamber 27 of amplifier 3 and consequently no output signal is produced in channel 39$^3$. Athough there is a control stream issuing from orifice 31$^3$ at this time, this control stream is quite small as compared with the power streams, hence the flow of fluid into channel 23$^3$ as a result of the control signal applied to channel 19$^3$ is negligible.

Consider now the case where signal source 11 applies a fluid signal to control signal input channel 19$^1$ but signal source 13 does not apply a fluid signal to control signal input channel 19$^3$. In this case $(A\cdot\overline{B})$ the power stream flowing through channel 17$^1$ issues from orifice 25$^1$ and is deflected by the control stream issuing from orifice 31$^1$ so that it flows into output channel 23$^1$. From channel 23$^1$ the fluid flows through channel 39$^1$, power stream input channel 17$^3$, and orifice 25$^3$ and becomes the power stream for amplifier 3. Since no control stream is issuing from orifice 31$^3$ at this time the power stream passes through chamber 27$^3$ and into the output channel 21$^3$. Therefore, under this condition no fluid flows through channels 23$^3$ and 39$^3$.

Finally, consider the case where signal source 11 applies a fluid signal to control signal input channel 19$^1$ at the same time signal source 13 applies a fluid signal to control signal input channel 19$^3$. Since the signal A and B are present simultaneously an output signal should be produced, this signal being manifested by fluid flow into the channel 23$^3$.

The power stream issuing from orifice $25^1$ is deflected by the control stream issuing from orifice $31^1$ so that it flows into the output channel $23^1$. From channel $23^1$ the fluid flows through channel $39^1$ and power stream input channel $17^3$ to enter chamber $27^3$ through the orifice $25^3$. Upon entering chamber $27^3$ the power stream is deflected by the control stream issuing from orifice $31^3$ and it is deflected into the output channel $23^3$ and flows through the channel $39^3$.

From the above description it is seen that the amplifiers 1 and 3 produce an output signal manifested by fluid flow in channel $39^3$ only when the fluid signals A and B are simultaneously applied to the control signal input channels $19^1$ and $19^3$, respectively.

The truth of a logical equation involving more than two variables can be determined by adding an additional amplifier for each variable in the equation. The amplifiers are connected in series with the output channel 23 of one amplifier being connected to the power stream input channel 17 of the next amplifier in the series. A continuous power stream is applied to the power stream input channel 17 of the first amplifier and fluid flows in the output channel $23^3$ of the last amplifier in the series only if each amplifier in the series has a control signal applied to its control signal input channel.

When connecting several amplifiers in series in the manner described above there is some loss of power or degradation of the power stream as it flows through each of the amplifiers. Therefore, it may at times be desirable to insert in the AND gate system one or more amplifiers for amplifying the power stream.

In the simplified system shown in the drawing the amplification function is performed by amplifier 5 while the amplifiers 1, 3 and 7 operate to determine the truth of the logical equation $X=A \cdot B \cdot C$. Amplifiers 5 and 7 are identical to the amplifiers 1 and 3 previously described and in the drawing like elements bear the same reference numerals with an appropriate superscript.

When functioning in an AND gate system to determine the truth of the logical equation $X=A \cdot B \cdot C$, output channel $39^3$ is connected to channel $37^5$ which is in turn connected to control signal input channel $19^5$. Signal source 15 intermittently produces fluid signals which are conveyed by means of channel $37^7$ to the control signal input channel $19^7$. Power stream input channel $17^5$ continuously receives fluid from power source 9. Output channel $23^5$ and power stream input channel $17^7$ are interconnected by the channel $39^5$. The truth of the logical function $X=A \cdot B \cdot C$ is manifested by fluid flow into the channel $23^7$ and the manifestation is conveyed by means of channel $39^7$ to an output device 41 which may be other fluid operated logical elements or fluid actuated mechanical devices.

Assuming output channel $39^3$ is connected to channel $37^5$ the four amplifiers shown in the drawing determine the truth of the logical function $X=A \cdot B \cdot C$ in the following manner. As explained above, fluid flows through channel $39^3$ only under the condition where signal source 11 applies fluid to control signal input channel $19^1$ at the same time signal source 13 applies a fluid to control signal channel $19^3$. The fluid flowing in channel $39^3$ passes through channel $37^5$ and control signal input channel $19^5$ to create a control stream in chamber $27^5$. This control stream deflects the power stream issuing from orifice $25^5$ into the output channel $23^5$ from whence it flows through channel $39^5$ and power stream input channel $17^7$ to enter chamber $27^7$. If signal source 15 is applying a fluid signal over channel $37^7$ to control signal input channel $19^7$ at this time the resulting control stream in chamber $27^7$ deflects the power stream issuing from orifice $25^7$ so that it flows through output channel $23^7$ to operate the output device and indicate the simultaneous presence of A, B and C.

If A and B are present but C is not present then the power stream issuing from orifice $25^5$ is deflected into output channel $23^5$ from whence it flows through power stream input channel $17^7$ and into channel $21^7$. In this case no fluid flows through output channel $23^7$ to actuate the output device.

If the signals A and B are not present at the same time then there is no fluid flow in channel $39^3$ and no control jet issues from orifice $31^5$. In this case the power stream emerging from orifice $25^5$ enters the chamber $21^5$. The presence or absence of the signal C under these circumstances is of no consequence since no power stream issues from orifice $25^7$.

Referring again to amplifier 1, there is a measurable time delay which occurs between the time a deflected power stream begins to flow into channel $23^1$ and the time this flow causes a power stream to emerge from orifice $25^3$ of the next amplifier. This delay is determined by many factors including the length and wall configuration of channels $23^1$, $39^1$ and $17^3$. If K amplifiers are connected in series then the delay becomes K times as great as for one amplifier. Where the truth of a logical equation having many variables is being determined, this delay becomes a problem if all of the amplifiers are connected in a series arrangement.

Figure 2:
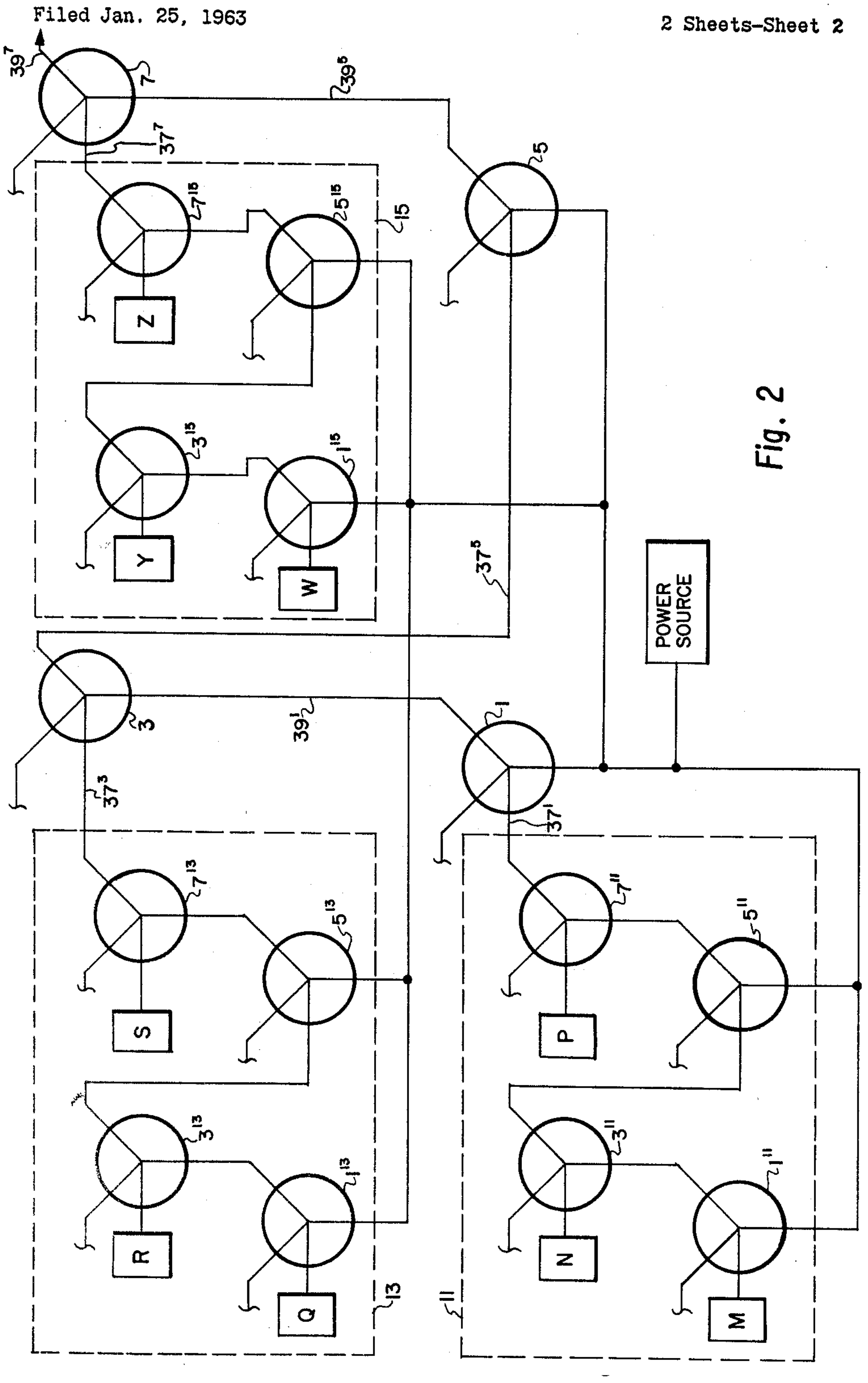
FIGURE 2 is a schematic diagram illustrating a second embodiment of the invention.

However, this delay may be reduced considerably by utilizing an AND gate system having a plurality of parallel groups each containing a plurality of series connected amplifiers. This is illustrated in schematic form in FIGURE 2 wherein fluid sources 11 and 13 each contains four amplifiers connected in series in the same manner as amplifiers 1, 3, 5 and 7. Thus, source 11 may produce the output signal A in channel $37^1$ only if three control signals M, N and P are applied simultaneously to its three control signal input channels. In like manner, source 13 may produce the output signal B in channel $37^3$ only if three control signals Q, R and S are applied simultaneously to its three control signal input channels and source 15 may produce the output signal C in channel $37^7$ only if three control signals W, Y and Z are simultaneously to its three control signal input channels.

In this case the device shown produces an output signal in channel $39^7$ in accordance with the logical equation $X=M \cdot N \cdot P \cdot Q \cdot R \cdot S \cdot W \cdot Y \cdot Z$. The total delay incurred is eight units. Four units of this delay occur in the four amplifiers of source 11 and one unit of delay occurs in each of the amplifiers 1, 3, 5 and 7. There are four units of delay in the four amplifiers of source 13 and another four units of delay in the four amplifiers of source 15 but these delays are concurrent with the delay in source 11 and do not add to the total delay. The parallel-series arrangement described includes sixteen amplifiers.

On the other hand, if all the amplifiers are connected in a series circuit to perform the function $$X=M \cdot N \cdot P \cdot Q \cdot R \cdot S \cdot W \cdot Y \cdot Z$$

only thirteen amplifiers are required assuming again only one stage for pure amplification following each second stage of pure logic. With thirteen series-connected stages the total delay is thirteen. Thus, a saving in delay time can be accomplished by utilizing more amplifiers if the amplifiers are connected in two or more parallel series. For the specific example described above, a saving of five units of delay is accomplished at the expense of adding three additional amplifiers.

While a preferred illustrative embodiment of the invention has been shown and described, obvious modifications and substitutions falling within the spirit and scope of the invention will be obvious to those skilled in the art. For example, induction fluid amplifiers such as the type shown in Patent No. 3,030,979 may be substituted for the amplifiers shown. In this case deflection of the power stream in each amplifier is accomplished through the viscous forces attracting the power stream to the control stream and the control stream to the side wall of the amplifier chamber. Alternatively, one or more of the amplifiers shown in the drawing may be replaced by fluid vortex amplifiers of the type shown and described in my copending application Serial No. 135,824 entitled "Fluid Multi-Stable Device." Furthermore, those skilled in the art will recognize that the device shown in the drawing may be easily converted to perform the negative AND function whereby a positive pressure output signal is produced only when no control signals are applied to any of the control signal input channels 19. To convert the device shown in the drawing to perform the negative AND function, the channels 39 are disconnected at one end from the channels 23 and connected instead to the channels 35. It is intended therefore to be limited only by the scope of the appended claims.

I claim:

1. A fluid operated AND gate comprising: first and second groups of series-connected fluid amplifiers, each amplifier having a power stream input channel, a first output channel for normally receiving a power stream emerging from said power stream input channel, a second output channel, and a control signal input channel responsive to fluid signals for deflecting a power stream emerging from said power stream input channel into said second output channel; means for applying fluid power streams to the power stream input channels of the first amplifier in each of said groups; and means for selectively and simultaneously applying fluid signals to the control signal input channels of all of the amplifiers in said first group and all amplifiers except one in said second group, said second output channel of the last amplifier in said first group being connected to the control signal input channel of said one amplifier in said second group and said second output channel of the other of said amplifiers being connected to the power stream input channel of the next amplifier in its group.

2. A fluid operated AND gate as claimed in claim 1 wherein said one amplifier in said second group is the first amplifier in said second group.

3. A fluid operated AND gate comprising: first, second and third groups of series-connected fluid amplifiers, each amplifier having a power stream input channel, a first output channel for normally receiving a power stream emerging from said power stream input channel, a second output channel, and a control signal input channel responsive to fluid signals for deflecting a power stream emerging from said power stream input channel into said second output channel; means for applying fluid power streams to the power stream input channels of the first amplifier in each of said groups; and means for selectively and simultaneously applying fluid signals to the control signal input channels of all of the amplifiers in said first and second groups, said second output channel of the last amplifier in said first and second groups being connected to the control signal input channels of two amplifiers in said third group and said second output channel of the others of said amplifiers being connected to the power stream input channel of the next amplifier in its group.

4. A fluid operated AND gate as claimed in claim 3 wherein said third group of series connected fluid amplifiers includes more than two amplifiers, and independently operable means for applying fluid signals to the control signal input channels of the amplifiers in said third group which are not connected to the second output channel of an amplifier in one of said first or second groups.

5. A fluid operated AND gate comprising: main channel means defining a path for fluid flow, said main channel means having a plurality of orifices therein disposed at different locations intermediate its ends; a corresponding plurality of secondary channel means each of which intersect said main channel means at an angle and downstream from one of said orifices to normally receive fluid flowing through said orifices; a corresponding plurality of selectively and independently operable sources of fluid control signals; a plurality of control signal channels each connected to one of said sources and terminating at an orifice in said main channel means at a location downstream from one of said main channel means orifices and upstream from its corresponding secondary channel means, said control channel orifices being positioned whereby fluid issuing from them deflects fluid issuing from said main channel orifices away from said secondary channel means and along said main channel means; means for continuously applying fluid to the upstream end of said main channel means whereby fluid flows through the downstream end of said main channel means only when all of said sources produce fluid control signals simultaneously; and further means responsive to fluid flow through the downstream end of said main channel means, said further means comprising a second main channel means having a plurality of orifices therein disposed at different locations intermediate its ends, a second plurality of secondary channel means each of which intersects said second main channel means at an angle downstream from one of said orifices of said main channel means to normally receive fluid flowing through said orifices, a second plurality of selectively and independently operable sources of fluid control signals, said plurality comprising one less than the number of secondary channel means in said second plurality of secondary channel means, a plurality of control signal channels each terminating at an orifice in said second main channel means at a location downstream from one of said main channel means orifices and upstream from its corresponding secondary channel means, all except one of said control signal channels being connected to a different one of the sources in said second plurality of sources and said one control signal channel being connected to the downstream end of said main channel means whereby fluid flow out of said main channel means or one of said second plurality of sources deflects fluid issuing from one of said second main channel orifices away from one of said second plurality of secondary channel means and along said second main channel means, and means for continuously applying fluid to the upstream end of said second main channel means.

References Cited by the Examiner

UNITED STATES PATENTS

| | | | |
|---|---|---|---|
| 3,001,698 | 9/61 | Warren | 235—61 |
| 3,075,548 | 1/63 | Horton | 137—610 |
| 3,093,306 | 6/63 | Warren | 235—61 |
| 3,107,850 | 10/63 | Warren et al. | 235—61 |

LAVERNE D. GEIGER, *Primary Examiner.*